United States Patent [19]
Adler

[11] Patent Number: 4,774,122
[45] Date of Patent: Sep. 27, 1988

[54] RESINOUS PRODUCT PROVIDED WITH SURFACE COATABLE WITH METAL LAYER BONDED THROUGH AN ARRAY OF MICRODENDRITES AND METAL-CLAD RESINOUS PRODUCT THEREOF

[76] Inventor: Edward Adler, 266 Arch Rd., Englewood, N.J. 07631

[21] Appl. No.: 19,239

[22] Filed: Feb. 26, 1987

[30] Foreign Application Priority Data

Oct. 14, 1986 [JP] Japan ................. 61-242174

[51] Int. Cl.⁴ .............. B44C 1/22; C03C 15/00; C03C 25/06; C23F 1/02
[52] U.S. Cl. ..................... 428/156; 156/151; 156/247; 156/630; 156/631; 156/633; 156/656; 156/902; 427/96; 427/307; 428/162; 428/164; 428/170; 428/172; 428/901
[58] Field of Search ............... 156/629, 630, 631, 633, 156/656, 664–666, 668, 902, 151, 152, 155, 247, 249; 428/131, 137, 141, 143, 156, 162, 164, 170, 172, 901; 427/96–98, 307

[56] References Cited

U.S. PATENT DOCUMENTS

| | | | |
|---|---|---|---|
| Re. 29,820 | 10/1978 | Komicek | 156/630 |
| 1,963,834 | 6/1934 | Decker | 156/233 X |
| 2,768,923 | 10/1956 | Kepple et al. | 156/655 X |
| 3,585,010 | 6/1971 | Luce et al. | 156/151 X |
| 3,801,427 | 4/1974 | Morishita et al. | 156/630 X |
| 3,864,147 | 2/1975 | Grunwald et al. | 156/630 X |
| 3,876,479 | 4/1975 | Yamada | 156/630 |
| 3,918,926 | 11/1975 | Wolski et al. | 156/151 X |
| 3,956,041 | 5/1976 | Polichette et al. | 156/629 |
| 3,984,598 | 10/1976 | Sarazin et al. | 428/336 |
| 4,087,300 | 5/1978 | Adler | 156/184 |
| 4,354,895 | 10/1982 | Ellis | 156/634 X |
| 4,643,798 | 2/1987 | Takada et al. | 156/630 |

FOREIGN PATENT DOCUMENTS

85/02969 7/1985 PCT Int'l Appl. .

Primary Examiner—William A. Powell
Attorney, Agent, or Firm—McAulay, Fields, Fisher, Goldstein & Nissen

[57] ABSTRACT

A resinous product is disclosed which possesses a resinous surface coatable with a layer of metal which can be bonded through an array of microdendrites extending below the resinous surface. The resinous products are prepared by coating the surface of a metal plate with microdendrites, pressing the microdendrite covered metal surface into the resinous surface, curing the resin and stripping away the plate to leave the microdendrites embedded in the cured resinous surface. The embedded microdendrites are dissolved away to produce a microrough resinous surface having an array of microdendrite-shaped cavities. The resinous product can be used for printed circuits and the like.

39 Claims, 4 Drawing Sheets

RESINOUS PRODUCT PROVIDED WITH SURFACE COATABLE WITH METAL LAYER BONDED THROUGH AN ARRAY OF MICRODENDRITES AND METAL-CLAD RESINOUS PRODUCT THEREOF

DETAILED DESCRIPTION OF THE INVENTION

This invention relates to a resinous product provided with a surface coatable with a metal layer, the metal layer is to be bonded to the resinous product through an array of microdendrites embedded into the resinous product, and to a metal-clad resinous product formed therefrom, and to a process for forming said resinous product and metal-coated resinous product. More specifically, according to the present invention, various resinous products having planar surfaces and objects of other geometric shapes having planar or non-planar surfaces, coated with strongly adhering metal layers by electroless deposition, can be provided. Most particularly, this invention relates to a double-sided planar board, in which printed circuits on opposing surfaces are interconnected integrally with through-hole plating.

Hitherto, copper, nickel and the like metals have been applied to a resinous, or plastic, substrate by methods such as electroless, i.e., chemical, deposition. These include reduction from solutions of their respective ions or by other procedures, such as vapor deposition and the like. Metal-clad resinous and plastic products are used for many purposes such as in decorative and industrial products and also in printed circuit boards.

The so-called additive processes, widely used in making printed circuit boards, comprise the electroless deposition of copper, nickel or the like metals on one or both major surfaces of a resinous, insulating substrate board and also in holes which may have been drilled through said board connecting the two major surfaces.

A major problem in the production of such metal-clad resinous substrates is a difficulty in obtaining adequate adhesion of the metal deposit to the substrate. Usual and well-known procedures in the additive process, for example, involve preliminary pre-treatment steps including alkaline cleaning followed by roughening of the surface either by mechanical procedures, such as sand blasting, brushing with abrasive powders and the like, or by chemical procedures, such as etching the surface with strong reagents such as sulfuric and chromic acids, or by procedures involving a combination of solvent attack or swelling of the resin, followed by etching (swell and etch techniques).

Subsequent steps consist of sensitization and activation treatments to catalytically initiate and promote the subsequent electroless metal deposition. Sensitization and activation agents include the salts of tin, palladium, titanium, silver and gold. Finally, the major electroless deposition step is carried out by the chemical reduction to metal, upon the prepared, sensitized and activated resinous surface, of salts of copper, nickel and other metals from solution. The pre-treatment steps above mentioned are especially important for promoting proper adhesion of the metal deposit to the resinous substrate. However, great care has been required, as excessive roughening detracts from the smoothness of the final metal-clad surface and insufficient roughening makes for inadequate adhesion. Moreover, chemical pretreatment procedures are difficult to control and frequently cause unhygienic conditions for workers due to solvent and acid fumes and require expensive procedures for control of gaseous and liquid pollutants.

Circuit boards have also been prepared by the so-called "subtractive process", where a copper foil is adhered to an insulating plastic laminate.

The present inventor first conceived and used procedures for preparing copper microdendrites on copper foil in the well-known "Treatment A" ("A" for Adler); Treatment A is used throughout the world for improving the adhesion of copper foil to insulating plastic laminates in the subtractive procedure, using copper-clad boards for making printed circuits.

Procedures for producing microdendrites on copper foils for purposes of improved adhesion are described in U.S. Pat. No. 3,585,010—June 15, 1971 by Luce, B., and Berdan, B.; U.S. Pat. No. 3,918,926—Nov. 11, 1975, Wolski A. and Yates, C. F.; U.S. Pat. No. Re29,280—Oct. 31, 1978, Konicek, J. R.; U.S. Pat. No. 3,984,598—Oct. 5, 1976, Sarazin, R. and Wilks; International Application No. 85/02969—July 4, 1985, Thorpe, J. E. and Sarang.

In these procedures, a layer of copper is subjected to electrolytic deposition of copper at relatively high cathode current densities and low cupric copper electrolyte concentrations to produce a copper layer surface comprised of microdendrites or tiny nodules. In the procedure most commonly used in industry, the microroughened copper layer is then combined with one or more layers of resinous prepreg and pressed between plates at elevated pressure and temperatures. The resin is thereby cured and the resulting product comprises a copper clad laminate. The microdendrite coating on the copper layer becomes embedded in the cured resin laminate, thereby greatly improving the adherence of the copper layer to the laminate. Variations of the above include that of Konicek who employs, instead of a discrete copper foil, a thin copper layer electroplated on an aluminum carrier layer. The surface of the copper layer is coated with microdendrites as previously described and is then combined with a prepreg in a press and cured. The aluminum carrier layer is then removed by chemical action to produce a thin copper layer with microdendrites embedded in the resinous surface.

E. Adler in U.S. Pat. No. 4,087,300—May 2, 1978, described a procedure for combining a so-prepared copper foil to a resinous substrate in long lengths or rigid boards by hot nip rolling, followed by autoclave curing at elevated temperatures and pressures. Thorpe and Sarang first form a sound, thin copper layer on a titanium carrier sheet by electrodeposition. This copper layer is then coated with microdendrites and the product is combined with a prepreg by heat and pressure in a press. The prepreg is thus cured and the titanium sheet separated to produce a copper clad laminate with microdendrites embedded in the cured resin.

In all the above prior art, a copper layer is coated with microdendrites and is then combined by pressing into a prepreg which is then cured. The product is a copper-clad laminate. The copper layer thereof is firmly attached to the resinous substrate by means of the microdendrites embedded therein.

The present invention is completely different from the above prior art. In one embodiment, it comprises coating a non-copper carrier plate such as titanium, chromium, stainless steel or lead-plated steel, with a layer of microdendrites formed of a highly conductive metal such as copper; pressing the microdendrite-coated carrier plate surface onto a prepreg or other resinous surface, thereby embedding the microdendrites in the prepreg; curing the prepreg; separating the carrier plate therefrom, leaving behind the microdendrites; and removing, by etching, the embedded microdendrites, to leave a cured, resinous product with microcavities in a surface thereof. Said surface containing said microcavities, provides a micro-rough base for subsequent electroless metal deposition, with improved adhesion between the deposited metallic layer and the base. Unlike the prior art, which is especially useful in the subtractive process for making printed circuits, the present invention is most useful in, but not limited to, the additive process for producing printed circuits and especially for additive processes involving through-hole connections.

Another object of the present invention is to eliminate the electrical failure of a printed circuit caused by solder blistering or separation, by providing for integral plating of desired circuits on two sides of a resinous plate, including a through-hole plating connecting the two sides with a properly adherent connection between the metal layers on the two sides of the resin.

Another object of the present invention is to provide a micro-rough surface on the resinous substrate consisting of an array of microdendrite-shaped cavities coatable with a metal layer, which would then be bonded strongly to the substrate, by said array of microdendrites, for a solid body of substantially any geometric shape, having non-planar or curved surfaces, as well as planar surfaces.

A further object of the present invention is to enable the use of many other kinds of plastic substrates than are now possible, including those which are cheaper or have specific desirable properties, for electroless plating for other than printed circuit use. Only special types of plastic such as ABS have hitherto been widely used.

In accordance with the present invention, there is provided a resinous product having a resinous surface which is coatable with a layer of metal so as to be bonded through an array of microdendrites extending below the resinous surface. The present invention is further characterized in that in preparing the resinous products, the surface of a metal plate is covered with microdendrites by, e.g., electrodeposition, and said microdendrite covered metal surface is pressed into the resinous surface; said resinous surface is cured and the plate is stripped away, leaving said microdendrites embedded in the cured resinous surface. The embedded microdendrites are dissolved away to obtain a micro-rough resinous surface consisting of an array of microdendrite-shaped cavities.

In an alternative embodiment, the invention provides a resinous product having a resinous surface and further comprising an embedded array of microdendrites in said cured resinous surface; the resinous surface being coatable with a metal layer which can bond through the array of microdendrites.

As resins which can be used in the present invention, there are included all resins changeable from a soft or softened state to a hard or hardened state, i.e., both thermosetting plastics and thermoplastic resins, in solid form or as laminates, alone or in combination. For example, a rigid thermoset resin, such as a phenolic resin or an epoxy resin, can be used to form a rigid board in a laminate, preferably from a layer (or layers) of partially polymerized thermosetting resin, each of which layer can be reinforced with fiber glass (commonly called a "prepreg"). Flexible resins, such as polyimides, polyesters, and the like, can also be used. In electroless plating of plastics for other than printed circuit use, only special types of plastic such as ABS (acrylonitrile-butadiene-styrene) are currently widely used, but according to the present invention many other plastics which are cheaper or have other desirable properties can be used.

The term "curing" or "cured" as used herein, except when the context indicates clearly otherwise, includes the hardening of a resin from a soft or softened state, to the hard state, and encompasses the completion of polymerization, as well as the cooling and hardening of a thermoplastic resin.

For the metal plate substrate, a metal other than the microdendrite metal should be used. Examples of such substrates include titanium, zirconium, stainless steel or a lead- or chromium-plated metal, such as steel, can be preferably used.

For preparing a printed circuit board, one or two microdendrite-covered, e.g., titanium, plate substrates (two plates for a double-sided circuit board) are prepared, and are then combined with an intermediate layer (or layers) of partially polymerized resin. The resin layer can be reinforced with fiber glass, in a form commonly called "prepreg". The resin layer is pressed against the dendritic surface of the metal plate at elevated pressures and temperatures, to cure the resin. After cooling, each metal plate is then separated from the cured resinous layer. The microdendrites remain embedded substantially entirely in the surface of the cured resinous layer. An appropriate etchant or solvent reagent, substantially inert to the resin, such as cupric ammonium chloride, cupric chloride, ammonium persulfate or the like, is then applied to the resinous surface to dissolve the embedded microdendrites from the resinous layer, leaving behind an array of microcavities in the surface of the resinous layer. These microcavities are substantially the female, or negative, replicas of the original metallic microdendrites, and form what is herein sometimes referred to as a "micro-rough" surface.

The above-described micro-rough surfaced resinous product of the present invention is thus provided with a surface coatable with a metal layer, e.g., nickel, bonded through an array of microdendrites locked into the array of microcavities. The desired metal coating can be obtained by means of known procedures of electroless deposition, with or without additional electrodeposition; the resulting metal layer obtained has a highly superior degree of adhesion to the resin, for example, a peel strength of 8 or more pounds per inch width for an overall 35-micron thick copper layer.

An alternative method for preparing the resinous product to provide enhanced adhesion of the metal layer of electroless deposition is characterized by preliminarily coating a microdendrite-covered metal plate surface with a resin solution, and drying and partially curing the resin solution. The resin-coated microdendrite surface of the metal plate is then pressed against a prepreg and said partially cured prepreg and resin coating are cured together. The metal plate substrate is stripped away, again leaving said microdendrites embedded in said cured prepreg surface; said microdendrites are dissolved away by an etchant to obtain said resinous product with the micro-rough surface. Said coating resin is preferably the same resin as in the prepreg.

When a thermoplastic resin is used, the adherent layer of microdendrites is preferably made to be structurally stronger and adherent than when using a thermosetting resin. Such strengthened microdendrites can be prepared by first electrodepositing, e.g., copper, onto a base metal surface, at high current densities, for a very short time in a copper sulfate solution; these initial microdendrites covering the metal surface are then made stronger and non-porous by electroless deposition of hard nickel, or by chromium electroless plating, all while maintaining a discrete separated dendrite structure. The metal base plate, covered with the strong, adherent microdendrite structure, is then pressed into a thermoplastic resinous layer at an elevated temperature above the resin softening point. The metal base plate, with the microdendrites still adhering to it, is then separated from the resinous layer, at the elevated temperature, and the resinous substrate is then allowed to cool and harden. The surface of said resinous substrate is covered by microcavities which are not exact negative replicas of the microdendrites, but correspond in number and approximate size thereto. Such a surface also can act as a base for adherent electroless deposition.

Although previously described in terms of simple planar surfaces, the products and processes of this invention are also adaptable for forming coatings on the surfaces of complex solid bodies having non-planar, or curved, surfaces. Such a solid body can be molded by a corresponding metal mold, the inner surfaces of which are formed including said microdendrites. For such a solid body, decorative metal layer surfaces with superior adhesion, for example, can be provided.

In yet another embodiment of this invention, a resinous product is provided comprising embedded into a surface thereof an array of metal microdendrites prepared as described above. This resinous product is also thus provided with a surface coatable with a metal layer to be strongly bonded to the resin through the array of preexisting microdendrites. Said microdendrite- containing resinous product can also be further processed by known electroless and electrodeposition techniques to provide an improved metal-clad laminate or metal-clad plastic article. The micro-rough surface, including the embedded metallic microdendrites, provides excellent locking conditions to promote good adhesion for subsequent electroless or electrochemical metal deposits. Most usefully, the electrical conductivity of a first electroless deposit of metal is markedly increased by the originally embedded metallic microdendrites. Thus, subsequent electrodeposition of a metal, such as copper, onto the electroless deposit is much easier and more rapid (higher current densities can be utilized) than with previous electroless deposits.

For the pre-embedded microdendrites, copper or copper electrodeposited with zinc, is also preferably used. When using a zinc coating, another embodiment of this invention can be prepared, i.e., copper microdendrites partially or loosely filling said microcavities. This can be prepared by selectively dissolving out the zinc coatings from the embedded copper microdendrites, by using a selective solvent/reagent, for example, sodium hydroxide solution. Such loosely embedded microdendrites provide even more improved adhesion for a subsequent coating of copper by electroless deposition.

The present invention encompasses not only the resinous product provided with the micro-rough surface coatable with the metal layer with and without the embedded microdendrites, but also the subsequently metal-coated resinous product, i.e., coated by an electroless depositing technique. Printed circuit boards are important examples of such coated resinous products.

The printed circuit board according to the present invention is characterized by a superior adhesion of the metal circuit coating for the resinous substrate even for fine line circuits. Further, for double-sided printed circuit boards, the circuits and the through-hole plating for connecting the two sides are able to be formed integrally without soldering connecting problems; electrical failure caused by blistering and separation of layers, are thus prevented.

Printed circuit boards are prepared according to the present invention. A double-sided circuit board is formed on double-sided micro-rough surfaces of a resinous, e.g., flat, plate, through which predetermined holes extend between the two surfaces. The two micro-rough surfaces and the interior surfaces of said holes are integrally coated in through-hole circuit configuration with the metal layer by electroless metal deposition.

In preparing the printed circuit boards, the microdendrites are preferably made catalytically active by adding small quantities of catalytic metals, such as nickel or palladium, prepared, e.g., by electrodeposition or cementation onto the copper or zinc dendrites on the base metal carrier plate before pressing against the resinous plate; alternatively, the catalytic metals are applied by cementation on the microdendrites embedded in the resinous surface after processing, especially when the embedded microdendrites are not to be dissolved out. These methods for adding catalytic quantities of such metals are well known. The exposed catalytically active microdendrites act as seeds or nuclei for electroless deposition without requiring additional sensitization or activation.

A further step in processing may include covering part of the surface of catalytic microdendrite-embedded cured resinous board with a resist, leaving uncovered the desired circuit pattern.

The desired printed circuit pattern can be directly electroless plated onto the resinous substrate in which the microdendrite-embedded, or micro-cavity containing, surface is prepared in the desired pattern. The microdendrite pattern can be initially formed in the desired pattern, or alternatively can be formed in an overall dispersion and then selectively covered with a suitable resist, before electroless coating with the metal layer.

Alternatively, the carrier metal base plates can be selectively coated with microdendrites in the form of the desired circuit pattern, by coating the remainder of the carrier plate surface with a resist by known means, such as silk screen printing, or photochemically, before subjecting the surface to electrodeposition, thus forming the metallic microdendrites only on the non-resist covered circuit areas.

In yet another embodiment, embedded metallic microdendrites arrayed in a circuit pattern on a resinous board, are directly soldered. For example, on a resinous plate, the entire surface of which is covered with the array of embedded microdendrites, the surface areas other than that of the desired circuit pattern is covered with a solder resist, followed by the use of known procedures for fluxing and soldering the remaining exposed microdendrites in the circuit pattern. Alternatively, a solvent resist covers only the circuit portions of a microdendrite-embedded resin board surface. The microdendrites in the remaining area are dissolved away by a suitable etchant: the resist is then removed and the circuit pattern then formed by suitable electroless deposition methods onto the remaining microdendrites.

It is sometimes desirable to electrodeposit upon the base metal carrier plate a flash pre-coat of copper or zinc, by electroplating, e.g., for a few seconds at a low current density, thus obtaining a very thin coherent deposit, and thereupon to deposit a layer of microdendrites over the flash coat. The microdendrites and the flash pre-coat will more readily separate from the metal carrier plate and remain embedded in the resinous prepreg. If desired, the thin flash pre-coat can be etched and dissolved out together with the embedded microdendrites. Or, flash etching, as with a weak, or diluted, etchant for a short time, may dissolve the pre-coat leaving behind the exposed, embedded microdendrites, which may then be further processed by electroless deposition as above.

The present invention improves double-sided printed circuits involving through-hole plating; the circuit and the through-hole plating is constituted integrally. The so-called additive processes are remarkably improved, and the difficulty of a circuit failure, caused by soldering, is eliminated. This is of great importance to the electronics industry. Further, a metal coating with superior adhesion can be provided to a solid body having non-planar or curved surfaces, especially useful for decorative and industrial products. In all cases, the range of the resins useful as the circuit board or product substrate is broadened, so that resins hitherto unusual can now be used for their special properties, including lower cost.

The invention will now be more specifically described in terms of examples within the scope set forth above. The drawings included herewith are diagrammatic renditions of specific embodiments prepared in accordance with this invention.

REFERRING TO THE DRAWINGS

Figure 9B:
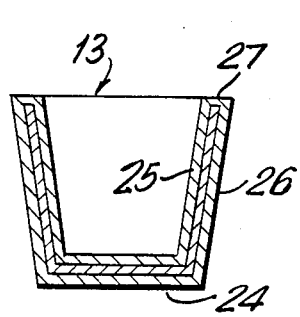
Figure 9A:
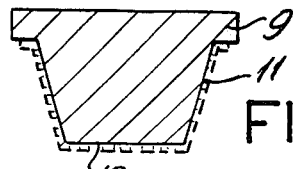
Figure 9C:
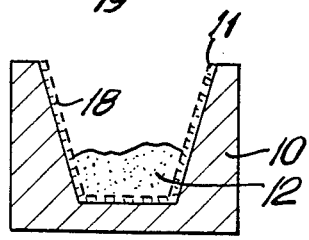
Figure 10:
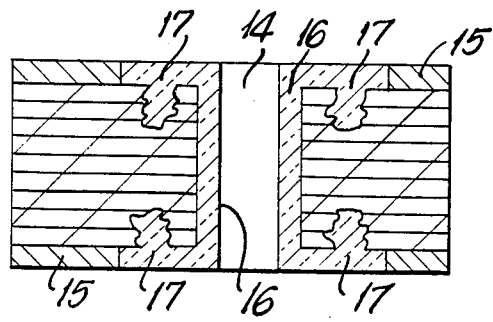
Figure 11:
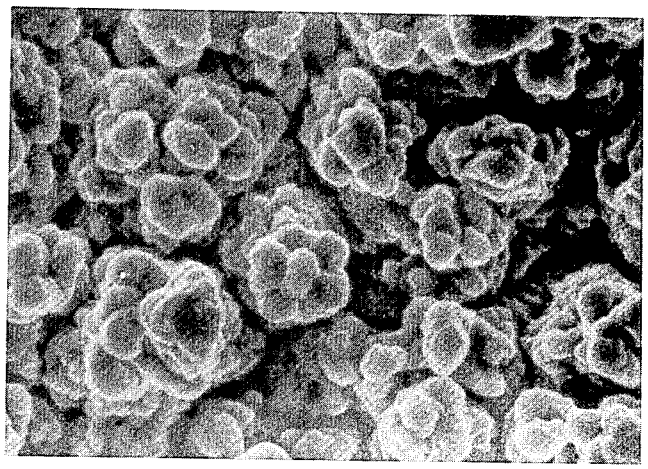
Figure 12:
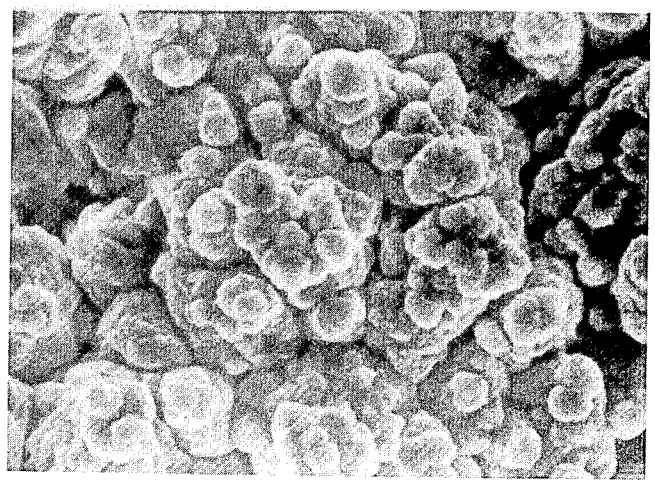

FIG. 9A-9C includes cross-sectional elevation views of male and female molds and of a molded container made therewith, the surfaces of which are covered with an array of microcavities;

FIG. 10 is a cross-sectional elevation view of a double-sided printed circuit board with through-hole plating; and FIGS. 11 and 12 are scanning-type electron microscope photographs (35000×) of metal surfaces covered with microdendrites of Example 1 and Example 2, respectively.

Referring to the drawings of FIGS. 1–8 and 10, the resinous board 1 is a fiberglass-reinforced epoxy laminate prepreg having microdendrite-shaped cavities 3 formed on both major surfaces 1a,b.

Figure 1:
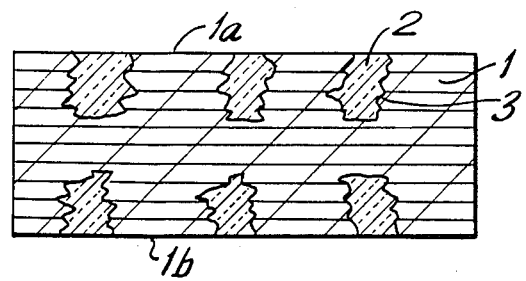
FIG. 1 is a vertical cross-sectional drawing of a resinous plate with embedded microdendrites on both surfaces.
Figure 2:
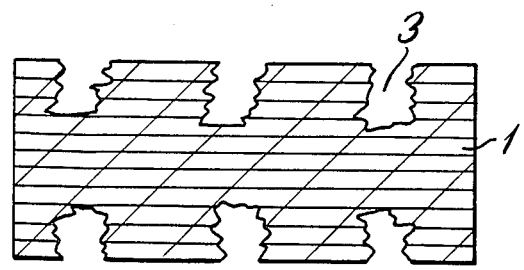
FIG. 2 is the vertical cross-sectional drawing, of the resinous plate of the invention showing the microdendrite-shaped cavities.

In FIG. 1, copper microdendrites 2 remain embedded in the cavities 3, and have been dissolved away in FIG. 2.

Figure 4:
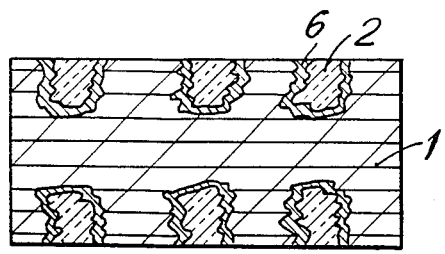
FIG. 4 is a vertical cross-section view of the resinous board of the invention, showing embedded microdendrites formed of copper plated with a zinc layer.
Figure 5:
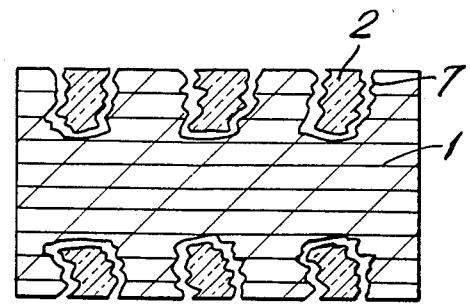
FIG. 5 shows the board of FIG. 4, wherein the zinc plating has been dissolved away.

In FIG. 4, copper microdendrites 2 with a zinc coating 6, are embedded in the cavities 3, while in FIG. 5 the copper microdendrites 2 remain loosely in the cavities 3 after the zinc coating has been dissolved away.

Figure 3:
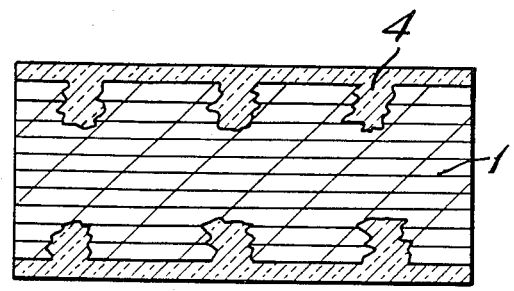
FIG. 3 is the cross-sectional view of FIG. 2, showing the subsequent electroless deposits of metal.
Figure 6:
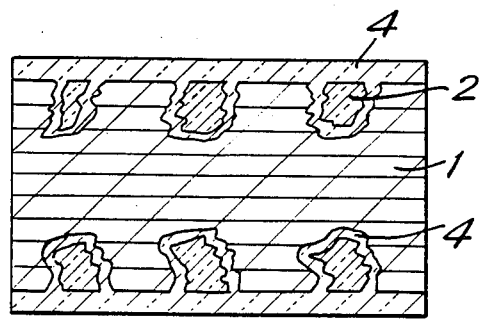
FIG. 6 shows the board of FIG. 5, provided with the electroless deposited metal layers.
Figure 7:
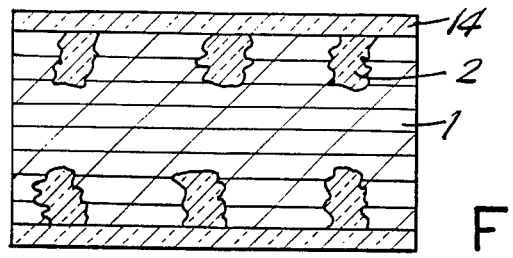
FIG. 7 is the cross-sectional view of the resinous board of FIG. 1 including an electroless metal deposit.

In FIG. 3, the micro-rough surfaces 1a,b of FIG. 2 have been coated with an electroless deposit coating 4 of metal, whereas in FIG. 7, the microdendrite-embedded surfaces of FIG. 1 have been covered with an electroless deposit coating 14. In FIG. 6, the loose microdendrites 2 of FIG. 5 lock in place the electroless deposit coating 24.

Figure 8:
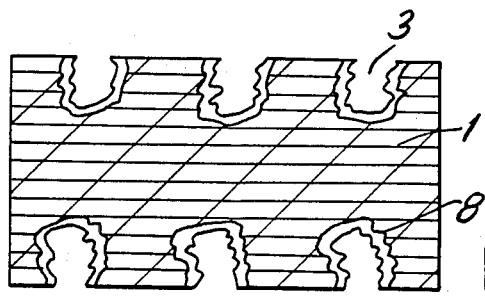
FIG. 8 is a vertical cross-sectional view of a resinous board with double-sided micro-rough surfaces in which the microcavities are coated with a resin layer.

In FIG. 8, the microcavities 3 are coated with a layer of resin 8, in accordance with this invention.

A decoratively coatable container 13 is prepared utilizing the male and female molds 9, 10 of FIG. 9. The inner surface 18 of the female mold 10 and the outer surface 19 of the male mold 9 are covered with microdendrites 11 to form a complexly shaped resinous object 13, formed from the PVC powder 12. The surfaces of object 13, the internal and the external surfaces 24, 25, 26, are covered with microdendrites from the mold surfaces.

EXAMPLES

The present invention is illustrated by the following examples which, however, are not to be taken as limiting the scope of the invention.

EXAMPLE 1

Two sheets of titanium metal are initially processed by the following steps:
(1) Clean a surface of each sheet by brushing with an alkaline cleaner and a pumice slurry.
(2) Rinse with water.
(3) Etch the cleaned surfaces with 10% aqueous hydrofluoric acid (100 gm/liter $NH_4F$) solution for 20 seconds to produce a fine matte surface.
(4) Rinse with water.
(5) Electroplate the cleaned titanium surfaces (as cathodes) in an aqueous electrolysis bath containing:
  15 g/l Cu (as copper sulfate)
  50 g/l sulfuric acid
  0.1 g/l arsenic
  0.5 g/l Antimony.
The electroplating is to be carried out in three stages. In the first stage, at a cathode current density of 4 amps/dm$^2$, for five seconds. In the second stage, lasting 10 seconds, at a cathode current density of 7 amps/dm$^2$. In the third stage, lasting 20 seconds, at a cathode current density of 1 amp/dm$^2$. The three stages are substantially continuous, without removing the the plates from the solution. Copper microdendrites are thus plated onto the titanium surfaces.
(6) Rinse the plated titanium in water.
(7) To stain-proof the plates, cathodically electrolyze the microdendrite-covered surfaces, in a 3 gm/l aqueous solution of CrO$_3$ at 0.5 amp/dm$^2$ for 10 seconds.
(8) Rinse the plates in water.
(9) Dry the plates.

The photograph (3500×) of FIG. 11 shows the titanium sheet surface covered with the microdendrites.

The microdendrite-covered surfaces of the titanium sheets, prepared as above, are placed against top and bottom outer surfaces of an assembly of 10 sheets of commercial epoxy resin impregnated fiber glass cloth (prepreg). The lay-up is pressed together at 300 lbs/sq.in. in an oven held at 325° F., for 2 hours.

The compressed assembly is cooled to below 150° F. and the titanium sheets are readily separated from the cured epoxy laminate, the top and bottom surfaces of which contain embedded copper microdendrites (as shown in FIG. 1), removed from the titanium metal surfaces.

The laminate is then immersed in an aqueous etching solution containing 2% (wt.) hydrogen peroxide and 10% (wt/) H$_2$SO$_4$, to dissolve away the copper microdendrites. The resulting laminate board has micro-rough surfaces, including an array of microcavities matching the microdendrites (as shown in FIG. 2).

The micro-rough surface of the laminate board is rinsed and coated with an electroless copper deposit by conventional procedures, as follows: The micro-rough surfaces of the laminate are sensitized with a stannous chloride solution and then rinsed. The rinsed surfaces are activated with a palladium chloride solution and then rinsed. The laminate is then immersed in an alkaline copper sulfate-Rochelle salt complex solution, and formaldehyde added as the reducing agent, to form the copper layer on the activated micro-rough surfaces. The electroless copper layer prepared as above (as shown in FIG. 3) had a peel strength of 9 lbs/in. width by the standard test, i.e., after the electroless copper layer was thickened by electrodeposition to a standard thickness of 35 microns.

The adhesion of the electroless copper deposit thus obtained is uniform over the entire area, and the adhesion of a fine line circuit can be also overall uniformly strong, in the manufacture of a printed circuit board.

EXAMPLE 2

Titanium sheets coated with copper microdendrites are prepared in accordance with Example 1, steps (1) through (6).

The copper microdendrites are coated with zinc by cathodic electrolysis in an aqueous solution, containing 10 gm/l zinc and 100 gm/l sodium pyrophosphate, for 10 seconds, at a current density of 3 amps/dm$^2$. The zinc-coated plates are rinsed, and then stain-proofed as in Example 1. FIG. 12 shows the titanium sheet surface covered with the zinc-coated microdendrites. An epoxy laminate having a pair of microdendrite embedded surfaces is formed as in Example 1, except that the embedded microdendrites are zinc-plated copper (see FIG. 4).

The laminate is then immersed in an etchant of 10% sodium hydroxide to dissolve out the zinc coating, leaving behind micro-cavities loosely holding copper microdendrites (see FIG. 5).

The laminate board is then rinsed and coated with an electroless copper deposit (see FIG. 6).

The electroless copper layer had a uniform peel strength of 10 lbs/in. width, measured by the standard method as in Example 1.

As a comparison, the peel strength of electroless copper layers prepared by prior conventional means are usually in the range of from 5 to 8 lbs./in., and are usually not uniform over the entire area. The present invention produces very uniform conditions of adhesion over the entire surface, which is especially important when fine line printed circuits are to be prepared.

EXAMPLE 3

An epoxy laminate having surfaces embedded with the copper microdendrites is prepared as in Example 1 (see FIG. 1). This laminate is electroless copper deposited, also in accordance with Example 1. (This is shown in FIG. 7.) When increasing the laminate thickness to the standard 35 microns by electrodeposition of copper, higher current densities can be used than for the copper electrodeposition of the laminate of FIG. 3, so that the electrodeposition time can be decreased by about 40%. The peel strength by the standard test was 10 lbs./in. width.

EXAMPLE 4

Example 3 is repeated with the addition of the zinc-coating of the copper microdendrite in accordance with Example 2. The zinc is not dissolved away. The same improvement is obtained as Example 3.

EXAMPLE 5

A titanium sheet covered with copper microdendrites is prepared as in steps (1) through (9) of Example 1 and is immersed in an ethyl acetate solution of an epoxy resin, and the titanium sheet is removed and dried. The epoxy resin on the titanium sheet is partially cured at 100° C. for 1 hour, leaving a layer of epoxy resin on the microdendrites A micro-rough surface is formed on an epoxy laminate using the above sheet and dissolving out the copper microdendrites. The inner surfaces of the micro-cavities thus formed are coated with the epoxy resin layer, as in FIG. 8. A copper layer is formed by electroless depositing on the micro-rough surface, as in Example 1. The peel strength of the copper deposit by the standard test is 10.5 lbs./in. width.

EXAMPLE 6

FIG. 9 shows the state in which the entire mating surfaces 18, 19, 20 of the stainless steel drape mold 9 and the stainless steel female mold 10, are covered with arrays 11 of the microdendrites. A decorative container 13, of the shape shown in FIG. 9, can be obtained by this process.

The mold surfaces 18, 19, 20 are formed of stainless steel and coated with the arrays of microdendrites 11 by following steps (5) through (9) of Example 1, using the stainless steel mold surfaces 18, 19, 20 as cathodes. Polyvinyl chloride molding powder 12 is put into the female mold 10, and is press molded at 100° C., and 10 kg/cm$^2$. After cooling to below 50° C., the molded product 13 is removed.

The surfaces 24, 25, 26, 27 of the container 13, which are embedded with arrays of the copper microdendrites over their entire areas are electroless deposited with copper by the process of Example 1, to obtain a polyvinyl chloride container coated with a copper layer having a superior degree of adhesion.

EXAMPLE 7

The epoxy laminate board provided with micro-rough surfaces formed by the arrays of the microdendrite-shaped cavities formed as in Example 1, is drilled in a predetermined place, and a resist (15 in FIG. 10), using MacDermid Solder Resist, from MacDermid Inc. of Waterbury, Conn. defining the circuit lines is printed on the double-sided surfaces by a conventional method. The resist-imprinted board is electroless copper deposited by the process of Example 1; a copper circuit 17 is formed on both surfaces integrally with the through-hole plating 16, eliminating any soldered connection between the two surface's circuits. According to this method, the conventional additive process for printing circuits is simplified, and the blowhole difficulty created by soldering connections is eliminated.

While a preferred embodiment of the invention has been described, the invention is not limited to the specific embodiments; it is to be understood that various changes may be made in the invention without departing from the spirit and scope thereof. With respect to the various standard or prior art procedures and tests used in conjunction with the invention, reference is made to the stndard text for this subject matter, *PRINTED AND INTEGRATED CIRCUITRY-MATERIALS AND PROCESSES*, T. D. Schlabach and D. K. Rider, 1963 (McGraw-Hill, New York).

The patentable embodiments of the invention which are claimed comprise:

1. A resinous product having a resinous surface which is coatable with a metal layer so as to be bonded through an array of microdendrites, the resinous product being prepared by a process which comprises pressing a metal surface coated with microdendrites into the resinous surface such that the microdendrites penetrate the resinous surface, curing the resinous surface, stripping apart said metal and resinous surfaces such that the microdendrites remain embedded in the cured resinous surface, and dissolving out said embedded microdendrites from the resinous product, to obtain a micro-rough surface comprising an array of microdendrite-shaped cavities extending into the resinous surface.

2. A resinous product as claimed in claim 1, in which the resin is a prepreg, and said microdendrites are dissolved away by an etchant to obtain said micro-rough surface on the resinous product.

3. A resinous product as claimed in claim 2, in which the metal surface is first coated with microdendrites by electrodeposition and further in which the microdendrite-covered metal plate is coated with a resin solution, followed by drying and partially curing said resin solution to form a resin coating on the metal surface, before the resin-coated metal plate is embedded into the prepreg, such that said microdendrites embedded in said cured prepreg are coated with the resin.

4. A resinous product as claimed in claim 1, in which the resin is thermoplastic, and said microdendrite-coated metal surface is pressed into the thermoplastic resin surface at an elevated temperature.

5. A resinous product as claimed in claim 1, in which the resinous product has opposed planar surfaces, at least one of which is a micro-rough surface.

6. A resinous product as claimed in claim 1, in which the resinous product has at least one non-planar micro-rough surface, said product being formed in a metal mold, the inner surfaces of which are coated with said microdendrites.

7. A resinous product having a resinous surface which is coatable with a metal layer so as to be bonded through an array of embedded microdendrites, the resinous product being prepared by a process which comprises pressing a metal surface coated with microdendrites into the resinous surface such that the microdendrites penetrate the resinous surface, curing the resinous surface, and stripping apart said metal and resinous surfaces, such that the microdendrites remain embedded in the cured resinous surface.

8. A resinous product as claimed in claim 7, in which the metal surface is first coated with microdendrites by electrodeposition and further in which the microdendrite-covered metal plate is coated with a resin solution, followed by drying and partially curing said resin solution, to form a resin coating on the metal surface, before the resin-coated metal plate is embedded into the prepreg, such that said microdendrites embedded in said cured prepreg are coated with resin and bonded more securely to the prepreg.

9. A resinous product as claimed in claim 7, in which the microdendrite-coated metal surface comprises zinc-coated copper microdendrites and in which the process further comprises the initial electrodeposition of copper on the metal surface to form the microdendrite coating, and further electrodeposition with zinc to form copper microdendrites electrodeposited with zinc.

10. A resinous product as claimed in claim 9, in which said copper microdendrites electrodeposited with zinc, embedded in said cured resinous surface, are treated with a selective etchant to remove only said zinc layer, to obtain a resinous product on which a surface is covered with an array of microcavities partially filled with copper microdendrites.

11. A metal-clad resinous product in which the metal cladding is bonded to the resin through an array of microdendrites, the product being prepared by a process which comprises pressing a metal surface coated with microdendrites into the resinous surface, such that the microdendrites penetrate the resinous surface, curing the resinous surface, stripping apart said metal and resinous surfaces such that the microdendrites remain embedded in the cured resinous surface, and dissolving out said embedded microdendrites from the resinous product to obtain a micro-rough surface comprising an array of microdendrite-shaped cavities extending into the resinous surface, and coating said micro-rough surface with a metal layer by electroless deposition, to obtain said metal-clad resinous product.

12. A metal-clad resinous product as claimed in claim 11, in which the resin is a prepreg.

13. A metal-clad resinous product as claimed in claim 12, in which the metal surface is coated with microdendrites by electrodeposition and the microdendrite-coated surface of the metal plate is coated with a resin solution, followed by drying and partially curing said resin solution, to form a resin coating on the metal surface before the resin-coated metal plate is embedded into the prepreg, such that said microdendrites embedded in said cured prepreg are coated with the resin.

14. A metal-clad resinous product as claimed in claim 11, in which the resin is thermoplastic, and said metal surface is pressed into the resinous surface at an elevated temperature, and then stripped from the resinous surface.

15. A metal-clad resinous product as claimed in claim 11, in which said metal layer is coated onto the resinous surface in a circuit configuration.

16. A metal-clad resinous product as claimed in claim 15, in which the resinous product is a flat plate having opposing planar surfaces, and in which the two planar surfaces are treated to form micro-rough surfaces, and further comprising a hole penetrating the plate at a predetermined location and defined by transverse surfaces interconnecting the two planar micro-rough surfaces, and further in which the metal layer is deposited to form an integral coating on the two planar surfaces and on the transverse surfaces.

17. A metal-clad resinous product as claimed in claim 16, in which the metal deposited is selected from the group consisting of copper and nickel.

18. A metal-clad resinous product as claimed in claim 17, also comprising a coating of an electrodeposition of copper on said electroless deposited metal.

19. A metal-clad resinous product in which the metal cladding is bonded to the resin through an array of microdendrites, the product being prepared by a process which comprises pressing a metal surface coated with microdendrites into the resinous surface such that the microdendrites penetrate the resinous surface, curing the resinous surface and stripping apart said metal and resinous surfaces such that the microdendrites remain embedded in the cured resinous surface, and said resinous surface embedded with said microdendrites is coated with a metal layer by electroless deposition to obtain said metal-clad resinous product.

20. A metal-clad resinous product as claimed in claim 19, in which the resin is a prepreg.

21. A metal-clad resinous product as claimed in claim 20, in which the metal surface is first coated with microdendrites by electrodeposition and the microdendrite-covered metal plate is coated with a resin solution, followed by drying and partially curing said resin solution, to form a resin coating on the metal surface before the resin-coated metal plate is embedded into the prepreg, such that said microdendrites embedded in said cured prepreg are more securely bonded to the resin.

22. A metal-clad resinous product as claimed in claim 21, in which the resin is thermoplastic, and said metal surface is pressed into the resinous surface at an elevated temperature, and then stripped from the resinous surface.

23. A metal-clad resinous product as claimed in claim 19, in which said metal layer is coated onto the resinous surface in a circuit configuration.

24. A metal-clad resinous product as claimed in claim 23, in which the resinous product is a flat plate having opposing planar surfaces, and in which the two planar surfaces comprise an array of embedded microdendrites and further comprising a hole through the plate defined by a transverse surface at a predetermined location, interconnecting the two planar, micro-rough surfaces, and further in which the metal layer is deposited to form an integral coating on the two planar surfaces and the transverse surface.

25. A metal-clad resinous product as claimed in claim 24, in which the metal electroless deposited is selected from the group consisting of copper and nickel.

26. A metal-clad resinous product as claimed in claim 25, comprising a coating of an electrodeposition of copper on an electroless deposit of copper.

27. A process for preparing a resinous product having a resinous surface which is coatable with a metal layer so as to be bonded through an array of embedded microdendrites, the process comprising: pressing a metal base surface coated with microdendrites into the resinous surface, such that the microdendrites penetrate the resinous surface; curing the resinous surface; and stripping apart said metal and resinous surfaces, such that the microdendrites remain embedded in the cured resinous surface.

28. A process as claimed in claim 27, further comprising dissolving out said embedded microdendrites from the resinous product, to obtain a micro-rough surface comprising an array of microdendrite-shaped cavities extending into the resinous surface.

29. A process as claimed in claim 28, in which the resin is a prepreg, and said microdendrites are dissolved away by an etchant to obtain said micro-rough surface on the resinous product.

30. A process as claimed in claim 28, further comprising initially coating the metal base surface with the microdendrites by electrodeposition; and coating the microdendrite-covered metal surface with a resin solution; and drying and partially curing said resin solution to form a partially cured resin coating on the microdendrites before the resin-coated metal plate is pressed against the prepreg.

31. The process as claimed in claim 28, in which the resin is thermoplastic, and said microdendrite-coated metal surface is pressed into the thermoplastic resin surface at an elevated temperature.

32. A process as claimed in claim 27, in which the microdendrite-coated metal surface comprises zinc-coated copper microdendrites, and in which the process further comprises electrodepositing copper on the microdendrite-covered metal surface; and then electrodepositing zinc thereover to form copper microdendrites electrodeposited with zinc, the zinc-coated microdendrites being embedded in the resinous product.

33. A process as claimed in claim 32, further comprising treating said zinc-coated copper microdendrites embedded in said cured resinous surface, with a selective etchant to remove only said zinc layer, to obtain a resinous product on which a surface is covered with an array of microcavities partially filled with copper microdendrites.

34. A process for preparing a metal-clad resinous product in which the metal cladding is bonded to the resin through an array of microdendrites, the process comprising pressing a metal surface coated with microdendrites into an uncured resinous surface, such that the microdendrites penetrate the resinous surface; curing the resinous surface; stripping apart said metal and resinous surfaces, such that the microdendrites remain embedded in the cured resinous surface; dissolving out said embedded microdendrites from the resinous product to obtain a micro-rough surface comprising an array of microdendrite-shaped cavities extending into the resinous surface, and coating said microrough surface with a metal layer by electroless deposition, to obtain said metal-clad resinous product.

35. A process as claimed in claim 34, in which the resin is thermoplastic, and said metal surface is pressed into the resin surface at an elevated temperature, and curing by cooling the resinous surface before it is stripped from the metal surface.

36. A process as claimed in claim 35, in which the resinous product is a flat plate having opposing planar surfaces, and in which the two planar surfaces are each treated to form micro-rough surfaces, and the process further comprising a hole penetrating the plate at a predetermined location interconnecting the two planar microrough surfaces prior to the electroless deposition, such that the metal layer is deposited to form an integral coating on the two planar surfaces and around said hole.

37. A process as claimed in claim 36, in which the metal deposited is copper or nickel.

38. A process as claimed in claim 37, further comprising coating said electroless deposited metal by the electrodeposition of copper.

39. A process for preparing a metal-clad resinous product in which the metal cladding is bonded to the resin through an array of microdendrites, the process comprising pressing a metal surface coated with microdendrites into an uncured resinous surface, such that the microdendrites penetrate the resinous surface; curing the resinous surface; stripping apart said metal and resinous surfaces, such that the microdendrites remain embedded in the cured resinous surface; and coating said resinous surface embedded with said microdendrites with a metal layer by electroless deposition to obtain said metal-clad resinous product.

* * * * *